US011417560B2

(12) United States Patent
Scholz-Goerlach et al.

(10) Patent No.: US 11,417,560 B2
(45) Date of Patent: Aug. 16, 2022

(54) APPARATUS FOR FIXING OBJECTS BY MEANS OF VACUUM

(71) Applicant: Laser Imaging Systems GmbH, Jena (DE)

(72) Inventors: Urban Scholz-Goerlach, Jena (DE); Uwe Klowsky, Jena (DE); Guenter Flemming, Zoellnitz (DE)

(73) Assignee: Laser Imagine Systems GmbH, Jena (DE)

( * ) Notice: Subject to any disclaimer, the term of this patent is extended or adjusted under 35 U.S.C. 154(b) by 979 days.

(21) Appl. No.: 16/092,910

(22) PCT Filed: Mar. 30, 2017

(86) PCT No.: PCT/DE2017/100251
§ 371 (c)(1),
(2) Date: Apr. 3, 2019

(87) PCT Pub. No.: WO2017/178005
PCT Pub. Date: Oct. 19, 2017

(65) Prior Publication Data
US 2019/0221467 A1  Jul. 18, 2019

(30) Foreign Application Priority Data

Apr. 12, 2016  (DE) ...................... 10 2016 106 706.7

(51) Int. Cl.
H01L 21/683 (2006.01)
H01L 21/687 (2006.01)
(Continued)

(52) U.S. Cl.
CPC ........ H01L 21/6838 (2013.01); B25B 11/005 (2013.01); B41F 15/20 (2013.01);
(Continued)

(58) Field of Classification Search
CPC ............. H01L 21/6838; H01L 21/3835; H01L 21/3875; H01L 21/38785; B25B 11/005; B41F 15/20; G03F 27/60
(Continued)

(56) References Cited

U.S. PATENT DOCUMENTS 2,133,518 A * 10/1938 Huebner ................ G03B 27/20
248/363
2,317,348 A  4/1943 Wekeman
(Continued)

FOREIGN PATENT DOCUMENTS

CN  2502819 Y  7/2002
CN  1532900 A  9/2004
(Continued)

OTHER PUBLICATIONS

Communication dated Jun. 17, 2020, from The China National Intellectual Property Administration in Application No. 201780022829.3.

(Continued)

Primary Examiner — Seahee Hong
(74) Attorney, Agent, or Firm — Sughrue Mion, PLLC

(57) ABSTRACT

A device for fixing different-sized base area objects with a vacuum including on a table: first, second, and third vacuum chambers. The third chamber extending the first and second chambers to the entire x direction extension, and the second chamber having parallel, line-forming grooves in the x direction and connected to each other by a first connection channel in the y direction and being released/closed serially relative to the first chamber by a line-switching device. The third chamber includes parallel, column-forming grooves extending in the y direction and connected to each other via a second connection channel in the x direction and being released/closed serially relative to the first chamber by a
(Continued)

column-switching device. The third chamber being released/closed serially in the y direction by the line-switching device, in a simultaneous, segmented manner according to the number and positions of the line-forming grooves in correspondence with the second chamber.

12 Claims, 5 Drawing Sheets

(51) Int. Cl.
   *B25B 11/00* (2006.01)
   *B41F 15/20* (2006.01)
   *G03F 7/20* (2006.01)

(52) U.S. Cl.
   CPC .......... *G03F 7/707* (2013.01); *H01L 21/6875* (2013.01); *H01L 21/68785* (2013.01)

(58) Field of Classification Search
   USPC ............................................ 248/363; 269/21
   See application file for complete search history.

(56) References Cited

U.S. PATENT DOCUMENTS

| | | | |
|---|---|---|---|
| 2,905,428 A | 9/1959 | Ribesehl et al. | |
| 2,914,289 A * | 11/1959 | Schutt | G03B 1/48 248/363 |
| 3,042,356 A | 7/1962 | Audino | |
| 3,172,358 A * | 3/1965 | Weiss | B41F 15/20 101/126 |
| 3,406,938 A | 10/1968 | Muir, Jr. | |
| 4,253,631 A * | 3/1981 | Sherman | G03B 27/64 248/363 |
| 5,857,667 A | 1/1999 | Lee | |
| 6,173,648 B1 * | 1/2001 | Misono | B25B 11/005 101/474 |
| 6,422,548 B1 | 7/2002 | Baber et al. | |
| 7,223,319 B2 | 5/2007 | Kurosawa et al. | |
| RE43,736 E * | 10/2012 | Brown | A41H 43/0292 269/21 |
| 2003/0102682 A1* | 6/2003 | Kurokawa | H01L 21/6838 294/188 |
| 2005/0126954 A1* | 6/2005 | Redding | H01L 21/67333 206/710 |
| 2006/0231454 A1* | 10/2006 | Van Egmond | H01L 21/67092 206/710 |
| 2009/0127760 A1 | 5/2009 | Wang | |
| 2009/0305617 A1* | 12/2009 | Nakamura | H01L 21/6875 451/364 |
| 2013/0087276 A1* | 4/2013 | Matthews | B41J 11/0085 156/272.4 |
| 2019/0143489 A1* | 5/2019 | Munkel | H05K 3/0085 269/21 |

FOREIGN PATENT DOCUMENTS

| | | |
|---|---|---|
| CN | 101441278 A | 5/2009 |
| CN | 203156623 U | 8/2013 |
| CN | 103354216 A | 10/2013 |
| DE | 37 10 404 A1 | 10/1987 |
| DE | 102008018347 A1 | 10/2009 |
| GB | 1 334 583 A | 10/1973 |
| JP | 01-201936 A | 8/1989 |
| JP | 04-159043 A | 6/1992 |
| JP | 07-231033 A | 8/1995 |
| JP | 2000-012663 A | 1/2000 |
| JP | 2007-103609 A | 4/2007 |
| JP | 2007-148414 A | 6/2007 |

OTHER PUBLICATIONS

German Examination Report of German Application No. 10 2016 106 706.7 dated Dec. 7, 2017.
International Search Report of PCT/DE2017/100251 dated Jul. 13, 2017 [PCT/ISA/210].

* cited by examiner

APPARATUS FOR FIXING OBJECTS BY MEANS OF VACUUM

CROSS REFERENCE TO RELATED APPLICATIONS

This applications is a National Stage of International Application No. PCT/DE2017/100251, filed Mar. 30, 2017, claiming priority based on German Patent Application No. 10 2016 106 706.7, filed Apr. 12, 2016.

The invention relates to a device for fixing objects by means of a vacuum.

In some cases, the processing, completion or inspection, in particular of very delicate objects, by machines is made possible only by the use of vacuum tables. In particular, in the case of very thin and flat objects, such as e.g. printed circuit boards, flat screen substrates, semiconductor wafers, or printed materials, the use of other, mostly locally acting clamping devices for secure and non-destructive fixation is hardly possible. Fixation on a vacuum table is a very gentle method for sensitive objects, because the forces required for fixation can be distributed over a large surface and evenly over the base area of the objects. Moreover, compared to other clamping means, the fixation by means of a vacuum is a very quick and easy operation.

In order for a vacuum to form for secure fixation of the object on the vacuum table, it is required, first of all, that the base area of the object terminates relatively close to the surface of the vacuum table. This prevents the vacuum suction from aspiring large amounts of ambient air, which would not allow the negative pressure to be generated for the vacuum. Furthermore, it is required, in particular for very thin objects, that the fixation be performed all the way to the edge of the base area of the object. For this purpose, the effective surface area of the vacuum table usually is to be dimensioned according to the base area of the object so that the vacuum table always covers the entire base area up to the edge. In this case, it would be required for differently dimensioned objects with differing base areas to have an adapted vacuum table ready for each object. This is expensive and impractical.

It makes more sense to use a universal vacuum table. The latter is dimensioned such that, if possible, all the different objects can be fixed thereon. If the objects are smaller than the effective surface area of the vacuum table, any surfaces not covered by the object must be sealed so as to maintain the vacuum. Solutions to this problem are already known from the prior art.

A solution for rotationally symmetric base areas is disclosed in published patent application JP H04-159043 A. It describes a circular vacuum table, which consists substantially of a table with a tabletop, which lie coaxially on top of each other. In one of its end faces, the table comprises a radially extending vacuum chamber, which extends linearly from the center to the edge region of the table. In the middle of the table, the vacuum chamber is much wider than in the edge region. The vacuum chamber has a connection to a vacuum extraction means and is covered by the tabletop. Objects which preferably have a circular base area are placed centrally on the tabletop and fixed by means of a vacuum. For this purpose, the surface of the tabletop is provided with a number of concentric annular grooves. The annular grooves each have channel bores, which lead to the underside of the tabletop and are arranged along a radially extending, straight line. The tabletop can be rotated with respect to the table about the common axis of rotation, with the channel bores being moved relative to the vacuum chamber. Depending on the position of the channel bores with respect to the vacuum chamber, it is possible, beginning from the outermost channel bore, to place individual channel bores outside the region of the vacuum chamber such that the channel bores located outside the vacuum chamber are closed by the table. Beginning from the outside, individual annular grooves can thus be separated, one after another, from the vacuum supply. The effective surface area of the vacuum table can thereby be annularly ajdusted to different diameters of the objects, the adjustment increments of said diameter depending on the number of annular grooves formed in the tabletop.

However, applying such a solution only makes sense for objects with rotationally symmetric or equilateral base areas. This solution is unsuitable for rectangular base areas with unequal aspect ratios.

Published patent application DE 37 10 404 A1 discloses a vacuum table for aspiring flat, rectangular objects which are present in specific formats of different sizes. In order to fix the different object formats all the way to their edge region, the effective surface area of the vacuum table is divided into a plurality of rectangular zones, which can be individually connected to a vacuum. To form the zones, the vacuum table includes a table. Vacuum chambers, unilaterally separated from each other, are formed in the table so as to correspond to the zones. The vacuum chambers of the table are covered by a tabletop which is perforated in a grid-like manner. The flat objects can be placed on the tabletop and fixed by a vacuum. A first vacuum chamber corresponds to the base area of the smallest possible object format. On two sides of the first vacuum chamber, a respective further vacuum chamber is arranged, which is dimensioned according to the difference in size to the next-larger object format. The further vacuum chambers enlarge the effective surface area of the vacuum table. Until the maximum object format is reached, still further vacuum chambers adjacent to the further vacuum chambers are formed in the table for each larger object format. In order to supply each vacuum chamber individually with a vacuum, the vacuum chambers are each connected to a switch valve, which is switched by means of a control device.

Due to the defined dimensions of the vacuum chambers, this solution is relativley inflexible, because objects which do not correspond to the envisaged increments of the object formats cannot be securely fixed in the edge region.

It is an object of the invention to make it possible to vary the effective surface area of a vacuum table in fine increments, so that objects with base areas differing in size can be securely arrested.

The object is achieved by a device for fixing objects by means of a vacuum, said device comprising a table extending in the directions of x and y and comprising a plurality of vacuum chambers, which are formed in the table in the direction of z in order to evenly distribute a vacuum connected to the table, and comprising a tabletop which is arranged to cover the table and the vacuum chambers and has a plurality of perforation holes arranged in a grid-like manner, wherein a first vacuum chamber is arranged directly below the tabletop, said first vacuum chamber defining a minimum format of an effective surface area of the table in the directions of x and y and contacting two adjacent lateral surfaces of the table and being permanently connected to a vacuum extraction means which is connected to the table, and wherein further vacuum chambers, enabling an extension of the effective surface area beyond the minimum format, are arranged in contact with at least one side of the first vacuum chamber and/or at least one of the sides of the further vacuum chambers, and all further vacuum chambers have a switchable connection to the vacuum extraction means, the object of the invention being achieved in that there are arranged on the table, in addition to the first vacuum chamber, a second vacuum chamber extending the first vacuum chamber to the entire extension in the direction of y, and a third vacuum chamber extending the first vacuum chamber and the second vacuum chamber to the entire extension in the direction of x, wherein the second vacuum chamber comprises a structure consisting of a plurality of parallel, line-forming grooves extending in the direction of x, which grooves are connected to each other by a first connection channel in the direction of y and can be released or closed serially with respect to the first vacuum chamber by means of a line-switching device, the third vacuum chamber comprises a structure consisting of a plurality of parallel, column-forming grooves extending in the direction of y, which are connected to each other via a second connection channel in the direction of x and can be released or closed serially with respect to the first vacuum chamber by means of a column-switching device, and the third vacuum chamber can be released or closed serially in the direction of y by means of the line-switching device, in a simultaneous, segmented manner and according to the number and positions of the line-forming grooves in correspondence with the second vacuum chamber, so as to achieve a column- and line-wise size adjustment of the effective surface area of the table in the direction of x and/or y.

The invention will be explained in more detail below with reference to exemplary embodiments. In the attached drawings.

Figure 1:
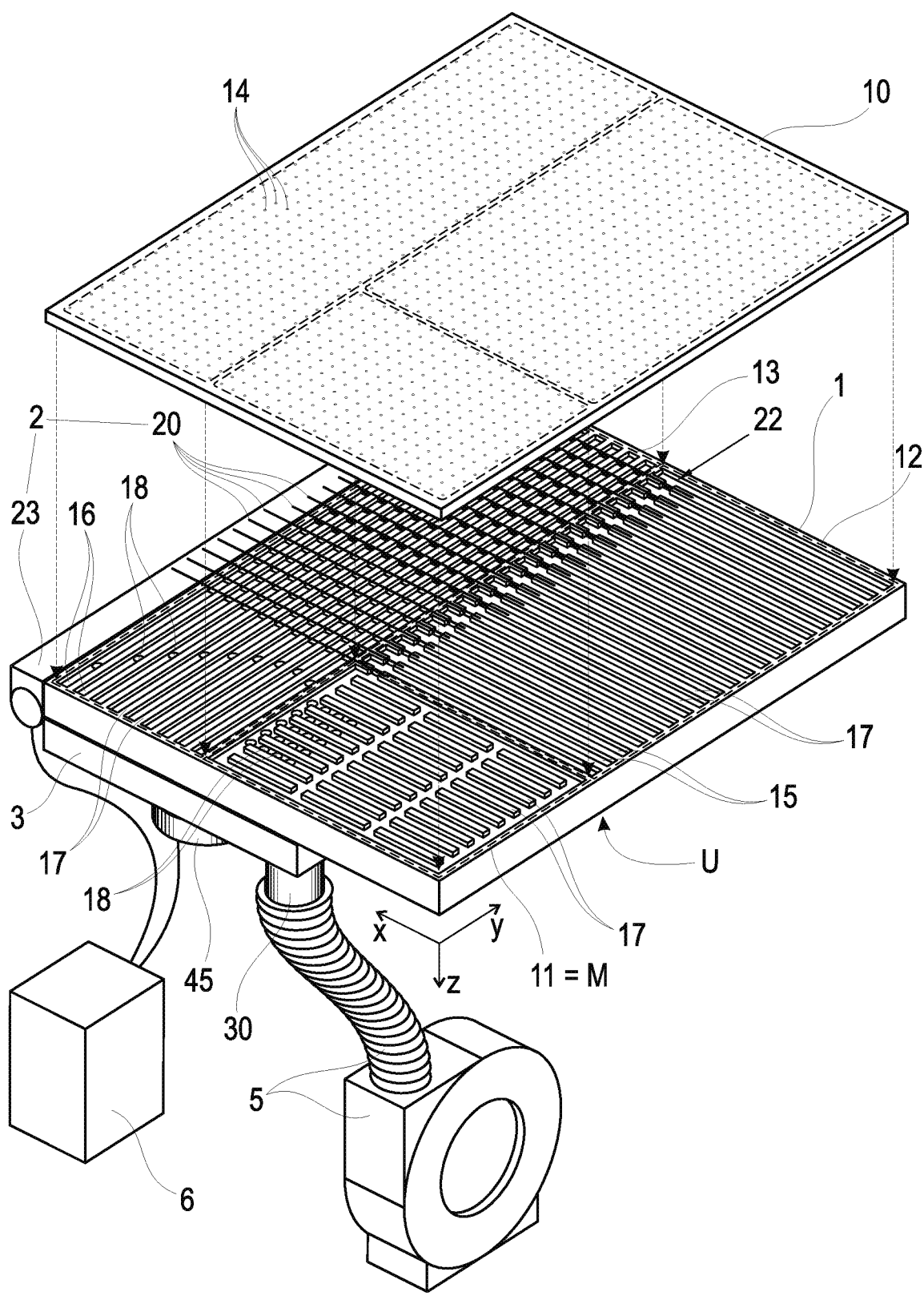
FIG. 1 shows perspective view of a basic design of the device for fixing objects by means of a vacuum.

The device for fixing objects by means of a vacuum is basically designed as shown in FIG. 1. It comprises a table 1, which extends in the directions of x and y, with vacuum chambers 11, 12, 13 formed in the table 1 in the direction of z, for planar distribution of a vacuum connected to the table 1. The vacuum chambers 11, 12, 13 are covered by a tabletop 10. A plurality of perforation holes 14 are arranged in a grid-like manner in the tabletop 10.

Directly below the tabletop 10, a first vacuum chamber 11 is arranged in contact with two adjacent lateral surfaces of the table 1. The first vacuum chamber 11 is permanently connected to a vacuum extraction means 5 connected to the table 1. It determines a minimum format M of an effective surface area W of the table 1 in the directions of x and y.

A second vacuum chamber 12 and a third vacuum chamber 13 enable an extension of the effective surface area W of the table 1 beyond the minimum format M of the first vacuum chamber 11. The second vacuum chamber 12 is arranged in contact with one side of the first vacuum chamber 11. The third vacuum chamber 13 is arranged in contact with one side each of the first vacuum chamber 11 and the second vacuum chamber 12. The second and third vacuum chambers 12, 13 each comprise a switchable connection to the vacuum extraction means 5.

In an embodiment of the device shown in FIG. 1, the tabletop 10 is shown in a position lifted from the table 1 in order to allow better visibility of the vacuum chambers 11, 12, 13. For the sake of clarity, the contours of the vacuum chambers 11, 12, 13 and of the minimum format M are shown as projections on the tabletop 10 in the form of broken lines.

As shown in FIG. 1, the first vacuum chamber 11, contacting a corner of the table 1, extends in a rectangular shape in the directions of x and y. The dimensions of the first vacuum chamber 11 are usually much smaller than those of the table 1 and are advantageously adapted to the dimensions of the smallest object to be received, which may be specified by standards, for example. Therefore, the dimensions of the first vacuum chamber 11 determine the minimum format M of the table 1. The dimensions of the object should correspond at least to the minimum format M so as to fix the object securely by the device. Since the entire first vacuum chamber 11 is permanently connected to the vacuum of the vacuum extraction means 5, the smallest effective surface area W of the table 1 is also defined by the minimum format M.

Within the first vacuum chamber 11, support structures 17 are arranged at regular intervals. When mounted, the tabletop 10 rests on the support structures 17 in the area of the first vacuum chamber 11. This ensures the evenness of the tabletop 10 under the action of the vacuum or the weight force of supported objects. The support structures 17 in the first vacuum chamber 11 may have any desired shape, as long as the perforation holes 14 of the tabletop 10 are not blocked and uniform and unhindered supply of the entire first vacuum chamber 11 with vacuum is ensured.

For connection to the vacuum, entrance bores 18, extending in the direction of z, are arranged in the first vacuum chamber 11. The entrance bores 18 exit the table 1 at an underside U of the table 1 opposite the tabletop 10. The number and size of the entrance bores 18 may vary and are adapted in accordance with the space between the support structures 17.

In order to extend the effective surface area W to the entire extension of the table 1 in the directions of x and y and beyond the minimum format M, the second and third vacuum chambers 12 and 13 are provided.

The second vacuum chamber 12 directly adjoins the first vacuum chamber 11. It also extends in a rectangular shape in the directions of x and y and has the same dimension in the direction of x as the first vacuum chamber 11. In the direction of y, it extends over the remaining extension of the table 1 in the direction of y next to the first vacuum chamber 11.

Within its x-y extension, the second vacuum chamber 12 is structured into a plurality of parallel, line-forming grooves 15 extending in the direction of x. Spaces remaining between the line-forming grooves 15, as described with regard to the first vacuum chamber 11, are used as a support structure 17 for the tabletop 10. Constructively defining the dimensions and spaces of the line-forming grooves 15 allows the size adjustment of the effective surface area W in desired increments, in the range between the minimum format M and the maximum extension of the table 1 in the directions of x and y.

The line-forming grooves 15 are connected to each other via a first connection channel 22 extending in the direction of y. The first connection channel 22 is arranged, within the second vacuum chamber 12, at the side adjacent to the third vacuum chamber 13. Said channel 22 continues into the first vacuum chamber 11, so that the second vacuum chamber 12 is connected to the vacuum of the first vacuum chamber 11 via the first connection channel 22.

The third vacuum chamber 13 is arranged adjacent to the first and second vacuum chambers 11 and 12 on the table 1. It is rectangular and extends over the extension of the table 1 in the directions of x and y remaining next to the first and second vacuum chambers 11, 12.

Within its x-y extension, the third vacuum chamber 13 is structured into a plurality of parallel, column-forming grooves 16 extending in the direction of y. The column-forming grooves 16 divide the third vacuum chamber 13 in the direction of x. Constructively defining the dimensions and spaces of the column-forming grooves 16 allows the size adjustment of the effective surface area W in desired increments. The spaces remaining between the column-forming grooves 16, as described with regard to the first vacuum chamber 11, are used as a support structure 17 for the tabletop 10.

Access to the column-forming grooves 16 is enabled by one respective entrance bore 18 formed in the direction of z and emanating from the underside U of the table 1. The connection of the column-forming grooves 16 outside the third vacuum chamber 13 is effected by a second connection channel 42 in which the entrance bores 18 terminate. The second connection channel 42 is part of a distributor housing 3, which will be described below.

In order to divide the second vacuum chamber 12 according to the arrangement of the line-forming grooves 15, a line-switching device 2 is arranged at the table 1. The line-switching device 2 comprises a serially acting linear drive 23 and a plurality of shutters 20. The number of shutters 20 corresponds to the number of line-forming grooves 15. Using the line-switching device 2, the connections established by the first connection channel 22 between the individual line-forming grooves 15 and between the first and second vacuum chambers 11 and 12 can be serially released or closed. The line-switching device 2 is controlled by a control device 6, which is connected to the linear drive 23.

The shutters 20 are sheet metal strips, which are received in the table 1 so as to extend in the direction of x and parallel to the x-z plane. The shutters 20 are received such that they can be moved in the table 1 in the direction of x. In the second vacuum chamber 12, the shutters 20 are each arranged exactly centrally in the spaces remaining between the line-forming grooves 15, i.e. extending centrally with respect to the support structures 17. Thus, they traverse the cross-section of the first connection channel 22, so that each shutter 20 can release or close a portion of the first connection channel 22 located between the shutters 20 and the respective line-forming groove 15.

In order to release the line-forming grooves 15, the shutters 20 comprise a breakthrough 21 in the direction of y within the second vacuum chamber 12. In the closed state, the breakthrough 21 of the shutter 20 is located within the support structure 17. The breakthrough 21 is covered and sealed by means of the support structure 17. For the releasing operation, the shutter 20 is moved by the linear drive 23 in the direction of x until the breakthrough 21 is located in the cross-section of the first connection channel 22. To make this clear, FIG. 1 shows the first seven of the shutters 20 following the first vacuum chamber 11 in an opened state and all further shutters 20 in a closed state.

Starting from the second vacuum chamber 12, the shutters 20 extend in the direction of x through the third vacuum chamber 13 and exit the table 1 laterally on the side of the third vacuum chamber 13. The exiting ends of the shutters 20 are connected to the linear drive 23 arranged there. Using the serially acting linear drive 23, the shutters 20, beginning at the first vacuum chamber 11 and continuing in the direction of y, can be opened sequentially and closed again in the opposite direction, respectively.

Using the shutters 20 extending through the third vacuum chamber 13, the third vacuum chamber 13 can also be divided in the direction of y, according to the line-forming grooves 15 of the second vacuum chamber 12. Within the third vacuum chamber 13, the movable support of the shutters 20 is effected in the support structures 17. The shutters 20 thus traverse the cross-sections of the column-forming grooves 16. With each shutter 20, the portion of each column-forming groove 16 located between the shutters 20 is respectively released or closed in parallel with one of the line-forming grooves 15 of the second vacuum chamber 12.

To release the portions of the column-forming grooves 16, further breakthroughs 21 in the shutters 20 are arranged in the area of the third vacuum chamber 13. The number and positions of the breakthroughs 21 correspond to the number and positions of the column-forming grooves 16. In the closed state, the breakthroughs 21 are located in the area of the support structures 17. The breakthroughs 21 are covered and sealed by the support structures 17. The size of the breakthroughs 21 and the spaces between the column-forming grooves 16 and the cross-sections of the support structures 17, respectively, are adapted to each other so as to completely cover and seal the breakthroughs 21 in the closed state of the shutters 20. As FIG. 1 shows for the first seven shutters 20, the shutters 20 are moved in the direction of x by the linear drive 23 for releasing, until the breakthroughs 21 are located in the cross-sections of the column-forming grooves 16.

Figure 3A:
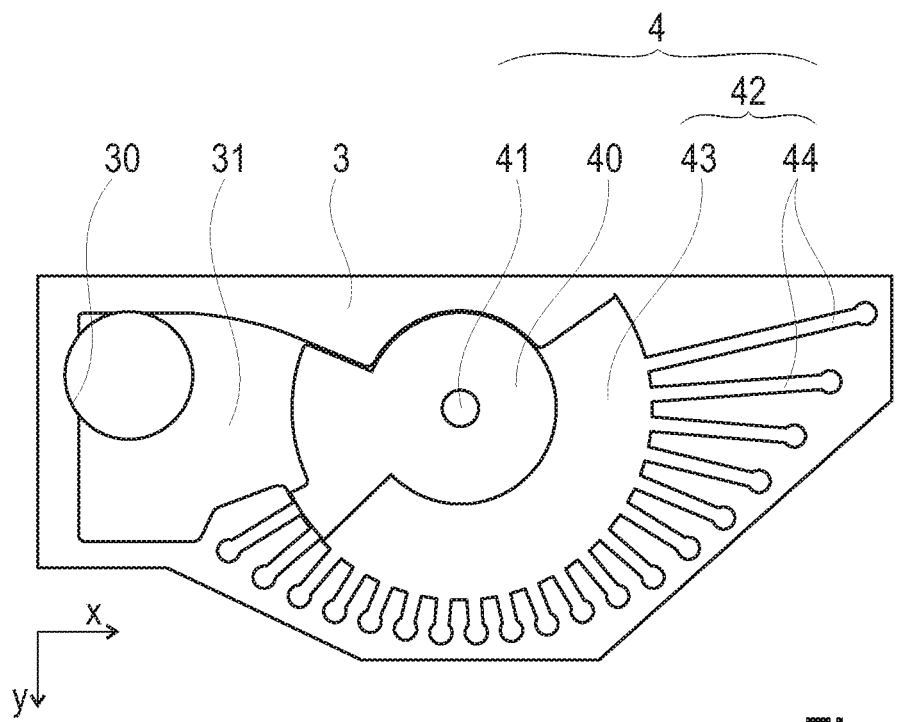
FIG. 3a shows a basic design of the distributor housing in the fully closed state of the column-switching device.
Figure 3B:
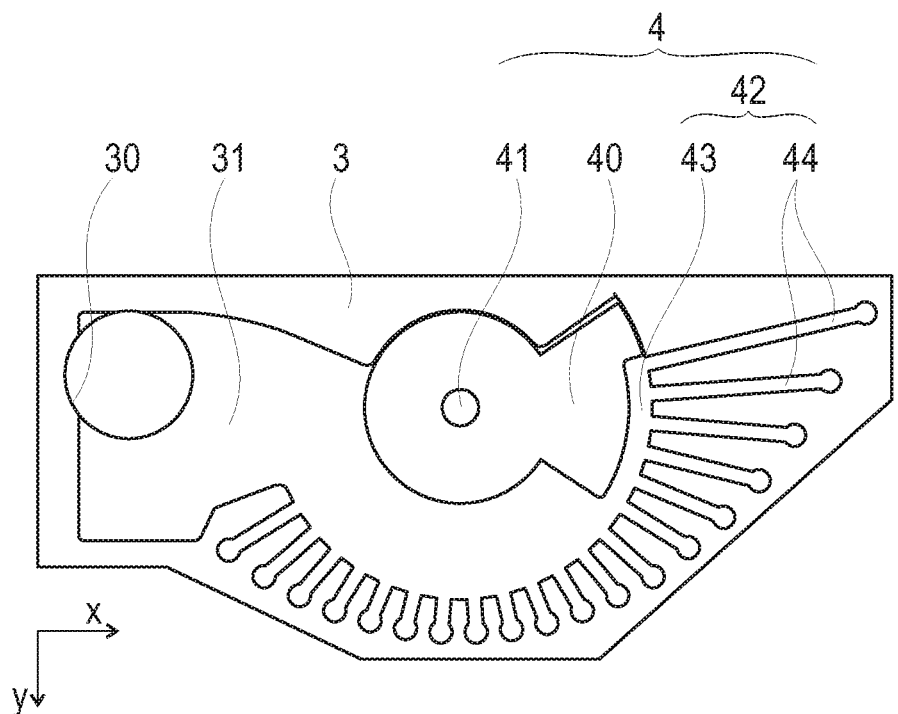
FIG. 3b shows a basic design of the distributor housing in the fully opened state of the column-switching device.

FIGS. 3a and 3b show the plate-shaped distributor housing 3 already mentioned above in connection with the third vacuum chamber 13. It is connected to the underside U of the table 1 and is provided for the connection and distribution of the vacuum. It includes a connecting flange 30 for the vacuum extraction means 5 and a column-switching device 4 for the third vacuum chamber 13. The plate-shaped distributor housing 3 is dimensioned at least such, in the directions of x and y, that all entrance bores 18 of the first and third vacuum chambers 11 and 13 can terminate in the distributor housing 3 on the underside U of the table 1.

As already shown in FIG. 1, the connecting flange 30 exits the distributor housing 3 in the area below the first vacuum chamber 11. The vacuum extraction means 5 is connected to the connecting flange 30. The connecting flange 30 terminates in a recess 31 inside the distributor housing 3. All entrance bores 18 of the first vacuum chamber 11 in the table 1 are arranged in the area of the recess 31.

The column-switching device 4 is formed by the second connection channel 42 and a rotary vane 40, which is rotatable about an axis of rotation 41 oriented in the direction of z. The second connection channel 42 is connected directly to the recess 31, with the separation of the second connection channel 42 from the vacuum permanently present in the recess 31 being effected by the rotary vane 40. The second connection channel 42 comprises a nearly semicircular chamber 43, arranged around the axis of rotation 41 and designed to receive the rotary vane 40 in a movable manner. From the chamber 43, individual channel-shaped entrances 44 lead up to the entrance bores 18 of the column-forming grooves 16 of the third vacuum chamber 13. The entrances 44 are arranged radially with respect to the axis of rotation 41 and each have a mouth opening into the chamber 43, which mouth can be closed and sealed by means of the rotary vane 40.

The use of the rotary vane 40 shall not be construed as limiting the constructive design of the column-switching device 4. In principle, any other arrangement of switchable valves is suitable for the column-switching device 4. The rotary vane 40 and the radial arrangement of the entrances 44 offer the particular advantage, in this case, of achieving maximum spreading of the second connection channel 42 in the direction of x and, simultaneously, a compact design of the column-switching device 4, whereby the size of surfaces to be sealed can be reduced to a minimum.

Figure 4:
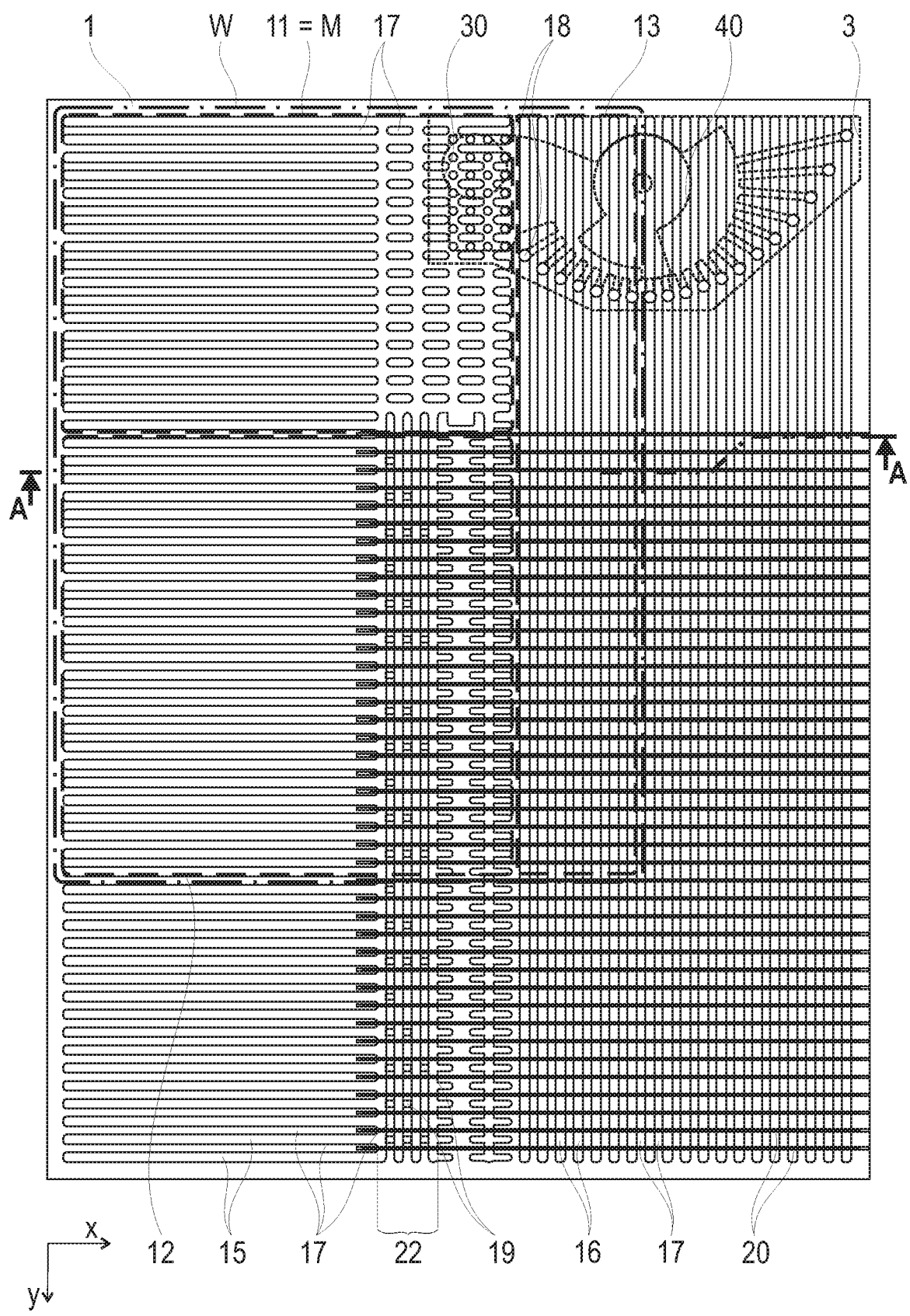
FIG. 4 shows another exemplary embodiment of the table in a top view, with an effective surface area greater than the minimum format.

A rotary movement of the rotary vane 40 about the axis of rotation 41 allows the mouths of the entrances 44 to be sequentially released or closed, so that the column-forming grooves 16 of the third vacuum chamber 13 are serially connected to the vacuum of the first vacuum chamber 11 or separated from the vacuum. FIG. 3a shows the rotary vane 40 in a completely closed state. In the closed state, the second connection channel 42 and, consequently, also the third vacuum chamber 13 is completely separated from the vacuum. FIG. 3b shows the rotary vane 40 in a completely opened state. In this state, all entrances 44 of the second connection channel 42 are released, so that all column-forming grooves 16 of the third vacuum chamber 13 are connected to the vacuum. As shown in FIG. 4, intermediate states of the rotary vane 40, between the closed and opened states, are also possible.

The rotational movement of the rotary vane 40 is generated by means of a rotational drive 45 shown in FIG. 1. The rotational drive 45 is connected to the control device 6 by which the movement of the column-switching device 4 is controlled. The rotational drive 45 comprises a self-locking transmission (not shown), by which e.g. a movement of the rotary vane 40 caused by the force of the vacuum extraction means 5 is prevented.

The combined use of the line-switching device 2 and the column-switching device 4 makes it possible, using the device for fixing objects by means of a vacuum, to perform a very differentiated size adjustment of the effective surface area W of the table 1 in the directions of x and/or y, wherein the extension or reduction in both directions may be performed independently. This allows any desired object format, between the minimum format M and the maximum x-y extension of the table 1, to be securely fixed.

Figure 2:
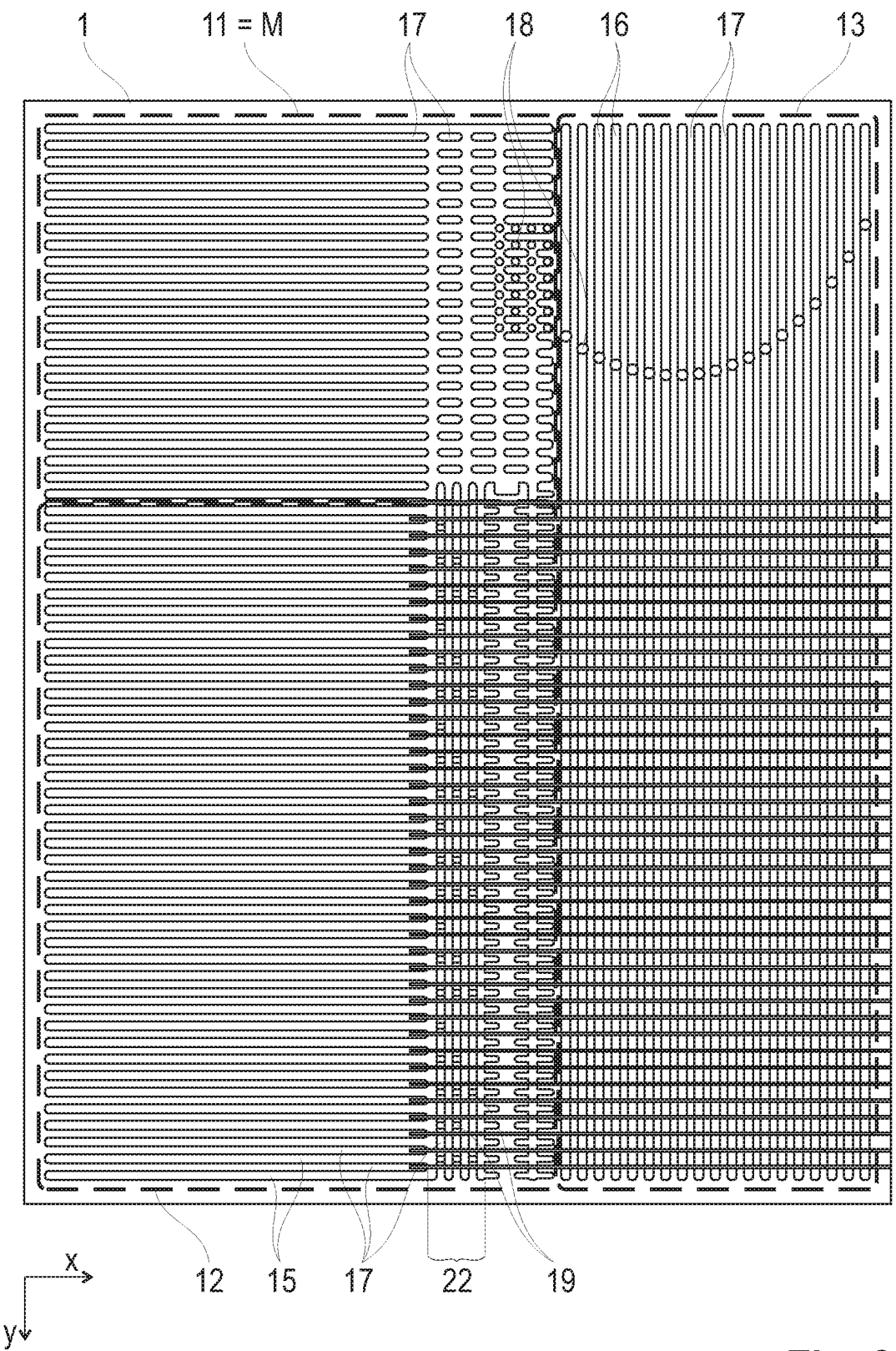
FIG. 2 shows another exemplary embodiment of the table in a top view with indicated contours of the vacuum chambers.

FIG. 2 shows another embodiment of the table 1. Compared to the exemplary embodiment shown in FIG. 1, the second and third vacuum chambers 12 and 13 are much more finely divided here. The finer division is achieved by narrower line-forming grooves 15 or column-forming grooves 16, respectively, and correspondingly smaller spaces between them. The contours of the vacuum chambers 11, 12, 13 and of the minimum format M are shown as broken lines. In order to supply the second vacuum chamber 12 sufficiently with the vacuum, the first connection channel 22 is wider. Over said width, support structures 17 extending in the direction of y are arranged within the first connection channel 22, with the support structures 17 being interrupted by means of cross connections 19 at regular intervals in the direction of x. The finer divsion allows even more differentiated size adjustment of the effective surface area W of the table 1 to the dimensions of an object format.

In the exemplary embodiment shown in FIG. 4, the size of the effective surface area W is set to an intermediate size, between the minimum format M and the maximum extension of the table 1, in the directions of x and y. The effective surface area W is shown as a dashed/dotted line. The proportion of the individual vacuum chambers 11, 12, 13 in the effective surface area W is shown in broken lines. The distributor housing 3 mounted to the underside U of the table 1 is indicated by a dotted line.

The extension of the effective surface area W exclusively in the direction of y beyond the minimum format M is performed in the second vacuum chamber 12 by the shutters 20 of the line-switching device 2. The shutters 20, which are located adjacent to the first vacuum chamber 11 within the effective surface area W to be adjusted, are in the opened state. In the opened state, the line-forming grooves 15 released by the respective shutter 20 are connected to the vacuum via the first connection channel 22. All shutters 20 outside the effective surface area W to be adjusted are in the closed state.

The extension of the effective surface area W exclusively in the direction of x beyond the minimum format M is performed in the third vacuum chamber 13 by the rotary vane 40 of the column-switching device 4. In the intermediate state of the rotary vane 40 shown in FIG. 4, only approximately the first third of the column-forming grooves 16 of the third vacuum chamber 13, which adjoin the first vacuum chamber 11 is connected to the vacuum.

The simultaneous extension of the effective surface area W in the directions of x and y beyond the minimum format M is performed in the part of the third vacuum chamber 12 adjacent to the second vacuum chamber 12 in the direction of x. This area of the table 1 can only be supplied with a vacuum if the line-switching device 2 and the column-switching device 4 are released at the same time. The size adjustment of the effective surface area W by lines and columns uses an overlapping effect of the line- and column-switching devices 2 and 4 in this area.

Figure 5:
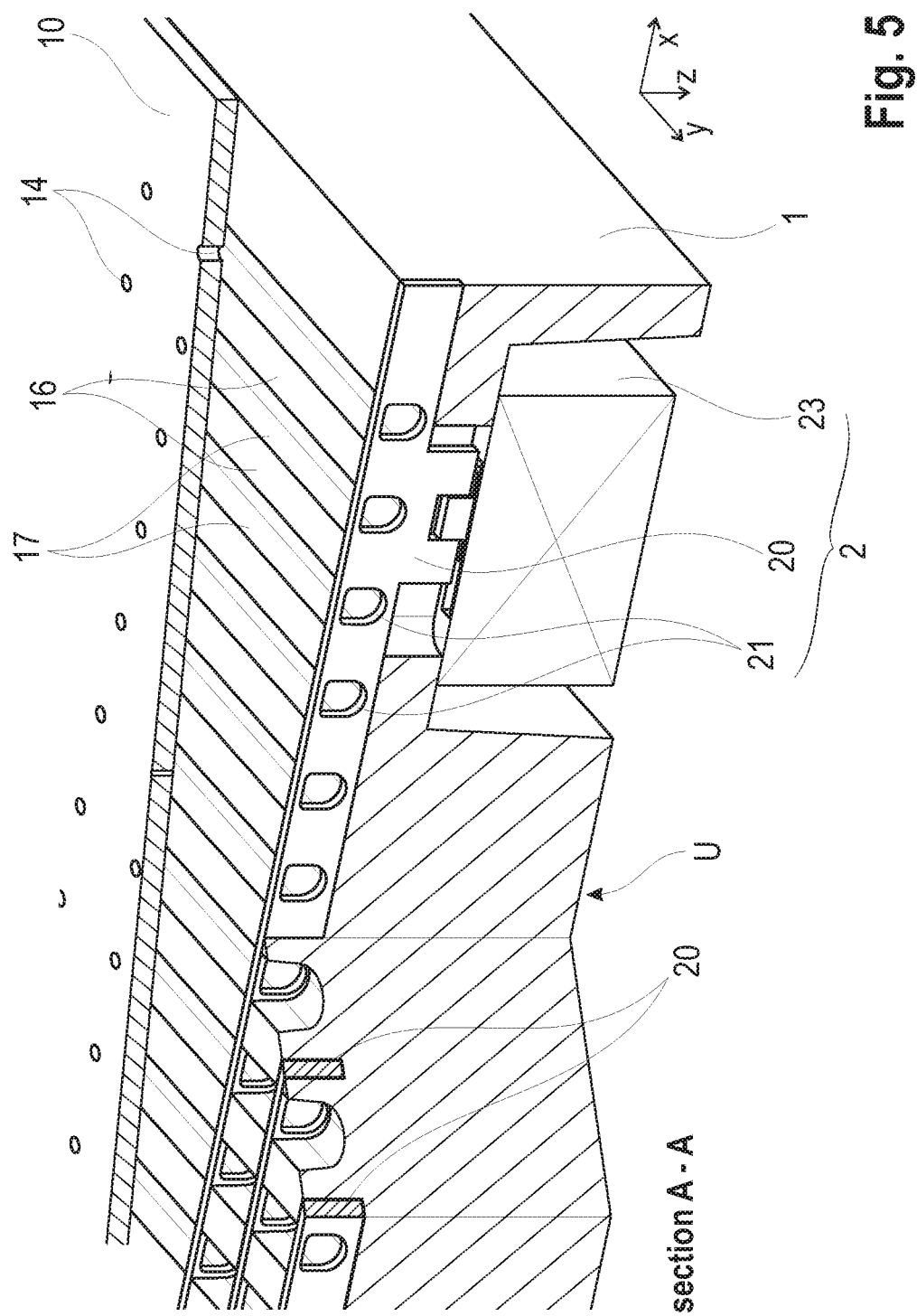
FIG. 5 shows a basic design of the line-switching device with a linear drive and a shutter in a part-sectional view of the table.

FIG. 5 shows the table 1 and the tabletop 10 in a partial section A-A through the third vacuum chamber 13. In the embodiment shown here, the serially acting linear drive 23 is mounted to the underside U of the table 1. The shutters 20 comprise a portion which is guided through the table 1 in the direction of z and is operatively connected to the linear drive 23. The linear drive 23 and the operative connection will not be explained in more detail here. As the linear drive 23, any form of drive is suitable by which the shutters 20 can be moved individually and serially, one after the other, in the direction of x. The shutters 20 are shown in the opened state. In the opened state, the breakthroughs 21 are located in the cross-sections of the column-forming grooves 16 of the third vacuum chamber 13, so as to be connected to the vacuum, depending on the state of the column-switching device 4.

In order to assume the closed state, the shutters 20 are moved by the linear drive 23 into the table 1 in the direction of x until the breakthroughs 21 are positioned completely within the cross-sections of the support structures 17.

By serially opening or closing the shutters 20, the column-forming grooves 16 of the third vacuum chamber 13, which have been released by means of the column-switching device 4, are each extended or reduced in size, by the width of one line-forming groove 15, in the direction of y by each shutter 20.

In another exemplary embodiment not shown, the effective surface area W can be extended on both sides of the first vacuum chamber 11 in the direction of x and/or the direction of y. For this purpose, the arrangement of the first, second and third vacuum chambers 11, 12 and 13, known from the previously described exemplary embodiments, is arranged with the first vacuum chamber 11 moved to the center of the table 1. On both sides of the first vacuum chamber 11, the second vacuum chamber 12 with the line-switching device 2 and the third vacuum chamber 13 with the column-switching device 4 are then arranged twice, i.e. mirror-symmetrically to the first vacuum chamber 11 in each case, on the table 1.

LIST OF REFERENCE NUMERALS 1 table
10 tabletop
11 first vacuum chamber
12 second vacuum chamber
13 third vacuum chamber
14 perforation holes
15 line-forming groove
16 column-forming groove
17 support structure
18 entrance bore
19 cross connections (in support structures 17 of first connection channel 22)
2 line-switching device
20 shutter
21 breakthrough
22 first connection channel
23 linear drive
3 distributor housing
30 connecting flange
31 recess
4 column-switching device
40 rotary vane
41 axis of rotation
42 second connection channel
43 chamber
44 entrances
45 rotational drive
5 vacuum extraction means
6 control device
M minimum format
U underside (of table 1)
W effective surface area

The invention claimed is:

1. A device for fixing objects by means of a vacuum, said device comprising a table extending in the directions of x and y and comprising a plurality of vacuum chambers which are formed in the table in the direction of z in order to evenly distribute the vacuum connected to the table, and comprising a tabletop which is arranged to cover the table and the vacuum chambers and has a plurality of perforation holes arranged in a grid-like manner, wherein a first vacuum chamber is arranged directly below the tabletop, said first vacuum chamber defining a minimum format (M) of an effective surface area (W) of the table in the directions of x and y and contacting two adjacent lateral surfaces of the table and being permanently connected to a vacuum extraction means which is connected to the table, and wherein at least one further vacuum chamber, enabling an extension of the effective surface area W beyond the minimum format M, is arranged in contact with at least one side of the first vacuum chamber and/or at least one side of the at least one further vacuum chamber, and the first vacuum chamber and said at least one further vacuum chamber have a switchable connection to the vacuum extraction means, wherein the at least one further vacuum chamber comprises a second vacuum chamber extending the first vacuum chamber to the entire extension in the direction of y, wherein the second vacuum chamber comprises a structure consisting of a plurality of parallel, line-forming grooves extending in the direction of x, which grooves are connected to each other by a first connection channel in the direction of y and can be released or closed serially with respect to the first vacuum chamber by means of a line-switching device, and a third vacuum chamber extending the first vacuum chamber and the second vacuum chamber to the entire extension in the direction of x, the third vacuum chamber comprises a structure consisting of a plurality of parallel, column-forming grooves extending in the direction of y, which are connected to each other via a second connection channel in the direction of x and can be released or closed serially with respect to the first vacuum chamber by means of a column-switching device, and the third vacuum chamber can be released or closed serially in the direction of y by means of the line-switching device, in a simultaneous, segmented manner and according to the number and positions of the line-forming grooves in correspondence with the second vacuum chamber, so as to achieve a column- and line-wise size adjustment of the effective surface area W of the table in at least one of the directions of x and y.

2. The device according to claim 1, wherein a distributor housing is arranged at the table by means of which distributor housing the vacuum extraction means is connected to the table.

3. The device according to claim 2, wherein the distributor housing has arranged therein the column-switching device and the second connection channel of the third vacuum chamber, said channel connecting the column-forming grooves with each other.

4. The device according to claim 2, wherein the first vacuum chamber and the third vacuum chamber comprise entrance bores for connection to the distributor housing.

5. The device according to claim 2, wherein the column-switching device is a rotary vane which is supported in the distributor housing so as to be positionable by means of a rotational drive.

6. The device according to claim 5, wherein the second connection channel comprises entrances which are arranged radially with respect to an axis of rotation of the rotary vane.

7. The device according to claim 1, wherein the first connection channel of the second vacuum chamber is arranged parallel to the side of the second vacuum chamber facing the third vacuum chamber.

8. The device according to claim 1, wherein the line-switching device comprises a number of parallel shutters extending in the direction of x, the number of the shutters corresponding to the number of line-forming grooves and the shutters being arranged in the area of the second vacuum chamber so as to extend through the first connection channel of the second vacuum chamber and through the third vacuum chamber.

9. The device according to claim 8, wherein the shutters comprise breakthroughs which are arranged in the shutter so as to correspond to the number and positions of the column-forming grooves of the third vacuum chamber and to the position of the first connection channel.

10. The device according to claim 9, wherein the shutters are each supported so as to be individually and sequentially movable in the table by means of a serially acting linear drive, so that the breakthroughs can be moved back and forth between a releasing or closing state.

11. The device according to claim 1, wherein the extension of the effective surface area (W) on both sides of the first vacuum chamber in the directions of x or y can be achieved by an arrangement of the second vacuum chamber and the line-switching device mirrored in the x-axis with respect to the first vacuum chamber or by an arrangement of the third vacuum chamber and the column-switching device mirrored in the y-axis.

12. The device according to claim 1, wherein the extension of the effective surface area (W) on both sides of the first vacuum chamber in the directions of x and y can be achieved by an arrangement of the second vacuum chamber and the line-switching device mirrored in the x-axis with respect to the first vacuum chamber and by an arrangement of the third vacuum chamber and the column-switching device mirrored in the y-axis.

* * * * *

UNITED STATES PATENT AND TRADEMARK OFFICE
CERTIFICATE OF CORRECTION

PATENT NO.        : 11,417,560 B2
APPLICATION NO.   : 16/092910
DATED             : August 16, 2022
INVENTOR(S)       : Urban Scholz-Goerlach, Uwe Klowsky and Guenter Flemming It is certified that error appears in the above-identified patent and that said Letters Patent is hereby corrected as shown below:

On the Title Page

Column 1, Assignee (73); delete "Laser Imagine Systems GmbH, Jena (DE)" and replace with
-- Laser Imaging Systems GmbH, Jena (DE) --

Signed and Sealed this
Twentieth Day of December, 2022

Katherine Kelly Vidal
*Director of the United States Patent and Trademark Office*